United States Patent
Hori

(10) Patent No.: US 7,867,829 B2
(45) Date of Patent: Jan. 11, 2011

(54) SEMICONDUCTOR DEVICE MANUFACTURING METHOD, SEMICONDUCTOR WAFER, AND SEMICONDUCTOR DEVICE

(75) Inventor: Yukitaka Hori, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 846 days.

(21) Appl. No.: 11/618,038

(22) Filed: Dec. 29, 2006

(65) Prior Publication Data

US 2008/0070347 A1    Mar. 20, 2008

(30) Foreign Application Priority Data

Sep. 15, 2006   (JP) .............................. 2006-250410

(51) Int. Cl.
*H01L 21/00* (2006.01)
(52) U.S. Cl. .................... 438/127; 438/114; 438/460; 438/465

(58) Field of Classification Search ................ 438/127, 438/114, 460, 465
See application file for complete search history.

(56) References Cited

FOREIGN PATENT DOCUMENTS

| JP | 59-229829 | 12/1984 |
|----|-----------|---------|
| JP | 64-69013  | 3/1989  |
| JP | 11-340268 | 12/1999 |
| JP | 2006-32482 | 2/2006 |

*Primary Examiner*—David A Zarneke
(74) *Attorney, Agent, or Firm*—Oblon, Spivak, McClelland, Maier & Neustadt, L.L.P.

(57) ABSTRACT

There is provided a semiconductor device manufacturing method which prevents cracking of an overcoat during polishing process, and a semiconductor wafer and a semiconductor device which have an overcoat free from cracking. A plurality of divided overcoats 10 are formed on each chip 3 in a chip region 2 and on each unavailable chip pattern in an unavailable region in the periphery of the chips 3 on the surface of a semiconductor wafer 1, and the semiconductor wafer 1 is mounted upside down on a table with an intervening film so that the back surface of the semiconductor wafer 1 is polished.

3 Claims, 3 Drawing Sheets

3 : CHIP
6 : EMITTER ELECTRODE
7 : GATE BONDING PAD
8 : GATE LINE
9 : GUARD RING
10 : OVERCOAT
11 : EMITTER BONDING REGION

3 : CHIP
6 : EMITTER ELECTRODE
7 : GATE BONDING PAD
8 : GATE LINE
9 : GUARD RING
10 : OVERCOAT
11 : EMITTER BONDING REGION

SEMICONDUCTOR DEVICE MANUFACTURING METHOD, SEMICONDUCTOR WAFER, AND SEMICONDUCTOR DEVICE

BACKGROUND OF THE INVENTION

The present invention relates to a semiconductor device manufacturing method, a semiconductor wafer and a semiconductor device.

There is known a semiconductor device manufacturing method includes the steps for forming devices on the surface of a semiconductor wafer, forming an overcoat on the surface of the semiconductor wafer with, for example, polyimide resin, mounting the semiconductor wafer upside down on the table of a polishing device with an intervening film in order to polish the back surface of semiconductor wafer while applying pressure by a revolving grinder.

It is disclosed in JP S59-229829A that in polishing the semiconductor wafer, an overcoat is formed on the surface of the semiconductor wafer so as to protect the devices formed on its surface with openings formed in electrode pad sections on the overcoat. It is disclosed in JP S64-069013A that an overcoat is formed and further a tape is stuck thereto so as to protect the devices in polishing process.

However, in the case of power semiconductor devices such as IGBTs (Insulated Gate Bipolar Transistor), the thickness of the devices, i.e., the thickness of the wafer, should be as small as 200 µm or less. Consequently, in conventional manufacturing methods for semiconductor devices, the film sometimes sags due to the actions of the turning effect and the pressure by a grinder in the polishing device, as a result of which strong stress is produced on the overcoat that is in contact with the sagging film, resulting in cracking of the overcoat during polishing process. This is more noticeable in those devices which require a longer polishing time, i.e., those devices which require a thinner wafer. Consequently, quite a number of devices become defective as the devices (inside thereof) are damaged when the overcoat cracks, the overcoat does not fulfill its original function so that an interconnection layer on the surface of the chip is disconnected or deformed due to the pressure of resin applied at the time of package molding, or water gets into cracked sections to cause characteristic error such as deterioration and fluctuation of withstand voltage.

SUMMARY OF THE INVENTION

Therefore, an object of the present invention is to provide a semiconductor device manufacturing method which prevents cracking of an overcoat during polishing process, and a semiconductor wafer and a semiconductor device which have an overcoat free from cracking.

A semiconductor device manufacturing method in a first aspect of the present invention includes the steps for forming a number of overcoats divided from each other on the surface of a chip region of a semiconductor wafer in which a plurality of chips is formed and an unavailable region which is in a periphery of the chip region so that each of the divided overcoats is smaller than an area of the chip at least in the unavailable region, mounting the semiconductor wafer upside down on a table with an intervening film, and polishing a back surface of the semiconductor wafer.

A semiconductor device manufacturing method in a second aspect of the present invention includes the steps for forming a plurality of divided overcoats on respective chips in a chip region on the surface of a semiconductor wafer, mounting the semiconductor wafer upside down on a table with an intervening film, and polishing a back surface of the semiconductor wafer.

According to the present invention, forming the overcoat also in the unavailable region enables the entire semiconductor wafer to receive pressure from a polishing device during polishing process, and this prevents disproportionate stress from being exerted on the semiconductor wafer. Even if bending stress is exerted on the semiconductor wafer, the bending stress is distributed to a plurality of the overcoats as the overcoats are divided small pieces, so that cracking of the overcoats is prevented.

DETAILED DESCRIPTION OF THE INVENTION

Embodiment 1

Figure 1:
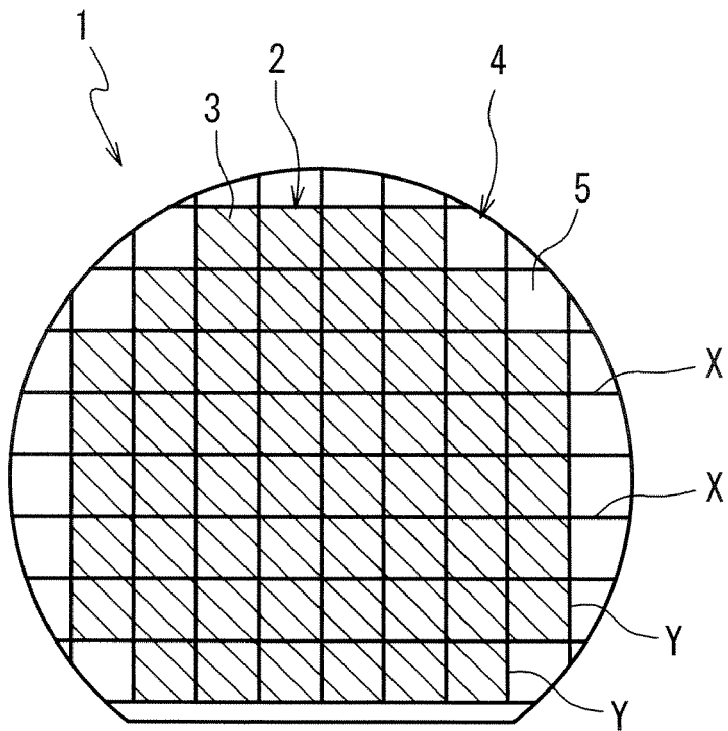
FIG. 1 is a schematic view showing a semiconductor wafer in a first embodiment of the present invention.

FIG. 1 is a schematic view showing the surface side of one semiconductor wafer 1 with a plurality of power semiconductor devices formed thereon in the first embodiment of the present invention. The semiconductor wafer 1 is defined by a plurality of orthogonal dicing line regions X, Y so as to form a chip region 2, a shaded area in the center, which is formed by arraying a plurality of chips 3. An unshaded area in the periphery of the chip region 2 is an unavailable region 4 in which the sufficient size of the chip 3 cannot be obtained. A plurality of the chips 3 and arrayed unavailable chip patterns 5 are formed.

Figure 2:
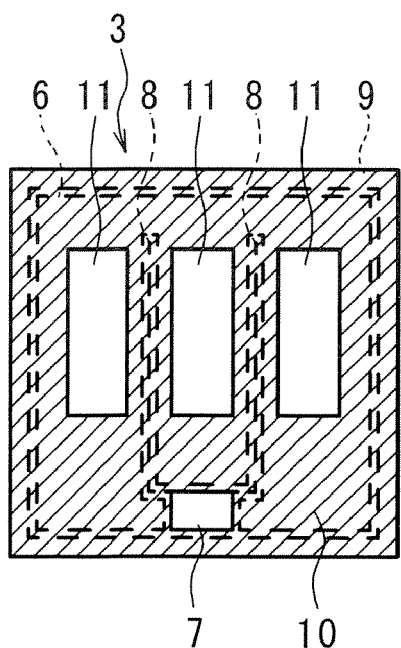
FIG. 2 is a detailed view showing a chip formed on a semiconductor wafer of FIG. 1.

FIG. 2 shows the detail of the chip 3 operating as one power semiconductor device. The chip 3 includes an emitter electrode 6 and a gate bonding pad 7 as metal interconnection layers made of aluminum and the like, and a gate line 8 extending from the gate bonding pad 7 so as to divide the emitter electrode 6. The chip 3 has a guard ring 9 formed in the periphery thereof.

The surface of the chip 3 is coated with, for example, polyimide resin as an overcoat 10, and the overcoat on the emitter electrode 6 and the gate bonding pad 7 has an opening section in order to allow electric connection to the outside of the chip 3 via wire-bonding and the like. The opening section in the emitter electrode 6 are divided into a plurality of sections by making the overcoat remain on the gate line 8 (the opening sections are hereinbelow referred to as emitter bonding regions 11).

Figure 3:
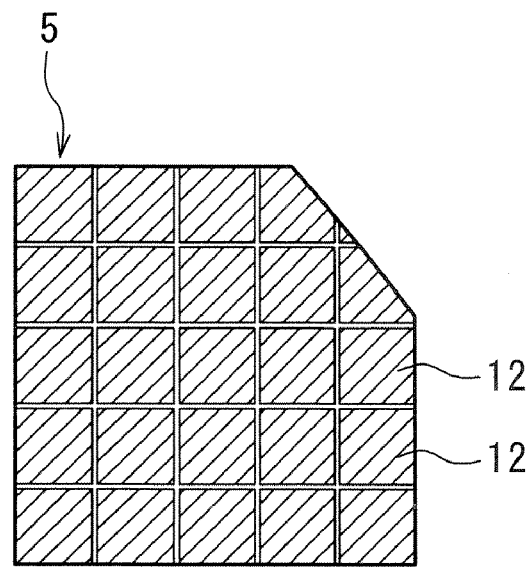
FIG. 3 is a detailed view showing an unavailable chip pattern formed in the semiconductor wafer of FIG. 1.

FIG. 3 shows the detail of the unavailable chip pattern 5. The unavailable chip pattern 5 has a plurality of overcoats 12 formed on the surface thereof, the overcoats 12 being formed by dividing an overcoat into a grid so that the area of an overcoat 12 becomes smaller than the area of a chip 3.

Further, after the overcoats 10, 12 are formed, the semiconductor wafer 1 is mounted upside down on the table of a polishing device with an intervening film so that the back surface thereof is polished with a grinder.

Description is now given of the operation of the semiconductor wafer 1 having the above structure.

In the present embodiment, the overcoats 12 are formed on the unavailable region 4, so that in the polishing process, not only the chip region 2 but also the unavailable region 4 are supported by the table. As a result, the pressure from the grinder is evenly received by the entire surface of the semiconductor wafer 1. Also, since a plurality of the overcoats 12 in the unavailable region 4 surrounding the chip region 2, which are formed by dividing an overcoat into pieces smaller than the area of a chip 3, alleviate (suppress) sagging of the film to decrease the stress, the stress in the chip region 2 can also be alleviated and the overcoat 10 in the chip 3 can be made less likely to have cracking.

Since cracking of the overcoat 10 on the chip 3 can be suppressed simply by changing the overcoat of the unavailable chip pattern 5 which is formed in the unavailable region 4, the semiconductor device can be applied in a wide product range regardless of the pattern of the overcoat 10 on the chips 3 arrayed in the chip region 2.

Embodiment 2

Figure 4:
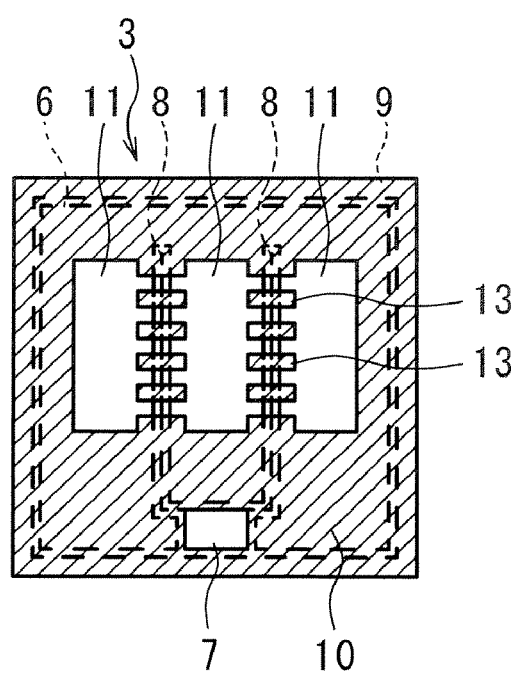
FIG. 4 is a detailed view showing a chip according to a second embodiment of the present invention.

FIG. 4 shows a chip 3 according to the second embodiment of the present invention. In the following description, the components identical to those in the first embodiment will be designated by identical reference numerals, and their description will be omitted.

The chip 3 in the present embodiment further includes a plurality of overcoats 13 which are formed by dividing the overcoat 10 into a plurality of pieces and which are placed in between the emitter bonding regions 11 in the chip in the first embodiment, i.e., on the gate lines 8.

In the present embodiment, the overcoats 13 are formed by dividing the overcoat, which sits on a section where stress is still locally concentrated in the first embodiment, i.e., which sits in between the emitter bonding regions 11, into a plurality of pieces. Since the overcoats 13 are made of small divided pieces, the stress is distributed to a number of the overcoats 13 so that the locally concentrated stress is decreased, and this can make the overcoats 10, 13 on the chip 3 further less likely to have cracking.

Embodiment 3

Figure 5:
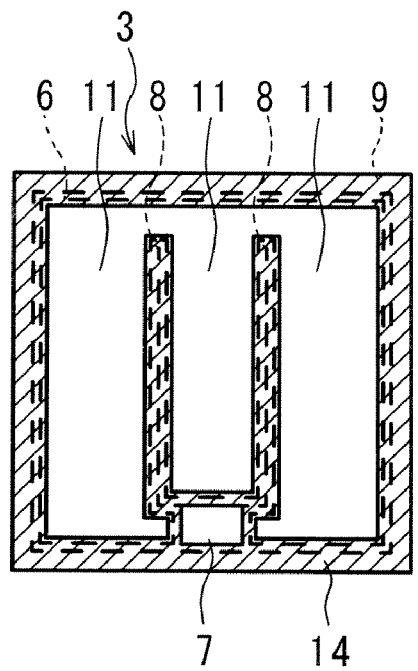
FIG. 5 is a detailed view showing a chip according to a third embodiment of the present invention.

FIG. 5 shows a chip 3 according to the third embodiment of the present invention.

The chip 3 in the present embodiment includes an overcoat 14 for covering the vicinity of a gate line 8, the periphery of a gate bonding pad 7, and the vicinity of a guard ring 9. It is to be noted that depending on the layout of the gate bonding pad 7, the overcoat 14 may be formed so that a section covering the vicinity of the gate line 8 and the periphery of the gate bonding pad 7 and a section covering the vicinity of the gate line 8 are separated.

In the present embodiment, the overcoat 14 is formed only in the section which may be damaged when coming into pressure contact with the table of a polishing device and which may thereby cause damage upon the functions of the chip 3. Accordingly, the overcoat 14 is formed so that its entire area is small and each area is generally separated from each other. Therefore, even if the film has local sagging in the chip region 2 (chip 3), the overcoat 14 can absorb the deformation and prevent cracking.

Embodiment 4

Figure 6:
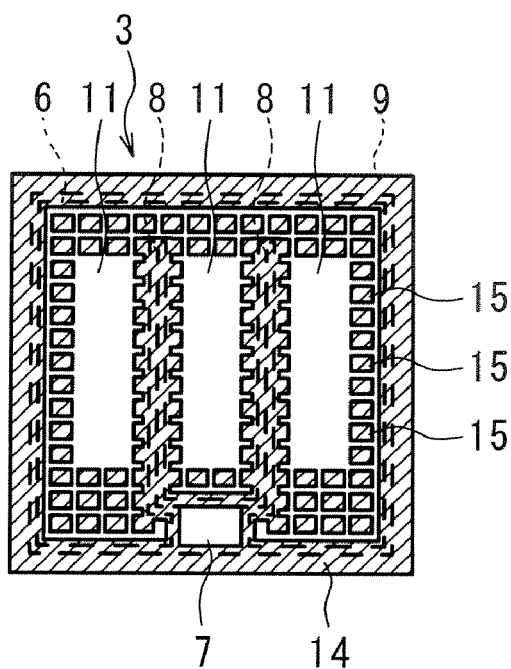
FIG. 6 is a detailed view showing a chip according to a fourth embodiment of the present invention.

FIG. 6 shows a chip 3 according to the fourth embodiment of the present invention.

The chip 3 in the present embodiment includes a overcoat 14 formed for covering the vicinity of a gate line 8, the periphery of a gate bonding pad 7 and a guard ring 9 as in the third embodiment, as well as a number of divided small overcoats 15 which are placed generally evenly on the entire surface of the chip 3 except an emitter bonding region 11 and the gate bonding pad 7.

In the present embodiment, the overcoats 15 are divided pieces smaller than those in the third embodiment, so that bending stress can be received in a further distributed state, which prevents cracking of the overcoats 14, 15.

The invention claimed is:

1. A semiconductor device manufacturing method, comprising the steps for:
    forming a number of overcoats divided from each other on a surface of a chip region of a semiconductor wafer in which a plurality of chips is formed and on a surface of an unavailable region which is in a periphery of the chip region so that each of the divided overcoats is smaller than an area of the chip at least in the unavailable region, wherein the overcoat of the chip region is formed only on a gate line and a guard ring;
    mounting the semiconductor wafer upside down on a table with an intervening film; and
    polishing a back surface of the semiconductor wafer.

2. The semiconductor device manufacturing method according to claim 1,
    wherein the overcoat of the chip region is formed on the respective chips in the state of being divided into a plurality of pieces.

3. A semiconductor device manufacturing method, comprising the steps for:
    forming an overcoat covering only a gate line and a guard ring on each chip in a chip region on a surface of a semiconductor wafer;
    mounting the semiconductor wafer upside down on a table with an intervening film; and
    polishing a back surface of the semiconductor wafer.

* * * * *